United States Patent
Wang

(10) Patent No.: US 11,062,779 B2
(45) Date of Patent: Jul. 13, 2021

(54) DATA PROCESSING SYSTEM AND DATA PROCESSING METHOD

(71) Applicant: Nuvoton Technology Corporation, Hsinchu Science Park (TW)

(72) Inventor: Cheng-Chih Wang, Jhubei (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 16/712,332

(22) Filed: Dec. 12, 2019

(65) Prior Publication Data
US 2020/0194083 A1 Jun. 18, 2020

(30) Foreign Application Priority Data
Dec. 12, 2018 (TW) .................. 107144669

(51) Int. Cl.
| | |
|---|---|
| *G11C 16/00* | (2006.01) |
| *G11C 16/22* | (2006.01) |
| *G11C 16/30* | (2006.01) |
| *G11C 16/10* | (2006.01) |
| *G06F 3/06* | (2006.01) |
| *G11C 16/14* | (2006.01) |

(52) U.S. Cl.
CPC .......... *G11C 16/225* (2013.01); *G06F 3/0604* (2013.01); *G06F 3/0659* (2013.01); *G06F 3/0679* (2013.01); *G11C 16/10* (2013.01); *G11C 16/14* (2013.01); *G11C 16/30* (2013.01)

(58) Field of Classification Search
CPC ... G11C 16/12; G11C 2207/104; G11C 5/145; G11C 7/1006; G11C 7/24; G11C 11/4074; G11C 16/10; G11C 16/14; G11C 16/225; G11C 16/30; G11C 5/14; G11C 5/147; G11C 16/22; G11C 16/06; H03L 7/0995; H03L 7/148; H01Q 1/2225
USPC ...... 365/189.09, 226, 189.11, 195, 196, 204, 365/230.03
See application file for complete search history.

(56) References Cited

U.S. PATENT DOCUMENTS

| | | | |
|---|---|---|---|
| 7,187,600 B2 * | 3/2007 | Sibigtroth .............. | G11C 5/145 365/189.09 |
| 2006/0062070 A1 * | 3/2006 | Sibigtroth .............. | G11C 16/12 365/189.11 |

* cited by examiner

*Primary Examiner* — Thong Q Le
(74) *Attorney, Agent, or Firm* — Muncy, Geissler, Olds & Lowe, P.C.

(57) ABSTRACT

A data processing system includes a memory device, a predetermined voltage generating circuit and a reference voltage generating circuit. The memory device stores system data and operates based on a system high voltage. The predetermined voltage generating circuit is coupled to the memory device and generates a predetermined voltage having a target voltage level according to a reference voltage. The target voltage level is the voltage level required for performing a write operation or an erase operation of the memory device. The reference voltage generating circuit generates the reference voltage. A voltage generator of the reference voltage generating circuit is enabled or disabled in response to a write protection signal, so as to selectively output the reference voltage. When the voltage generator is disabled, the reference voltage will not be output and the predetermined voltage having a target voltage level will accordingly not be generated.

10 Claims, 4 Drawing Sheets

DATA PROCESSING SYSTEM AND DATA PROCESSING METHOD

CROSS-REFERENCE TO RELATED APPLICATION

This application claims the benefit of Taiwan Patent Application No. 107144669, filed on Dec. 12, 2018, in the Taiwan Intellectual Property Office, the disclosure of which is incorporated herein in its entirety by reference.

BACKGROUND OF THE INVENTION

1. Field of the Invention

The present invention relates to a data processing system and a data processing method, and more particularly to a data processing system having a write protection mechanism, and a data processing method thereof.

2. Description of the Related Art

Non-volatile memory is a memory that can retain data after power-off and restart, and is widely used in various electronic products to store important code and data.

In normal use, data can be rewritten in a memory device and the code stored in the memory device can be updated. However, when the electronic product system is subjected to a malicious virus attack or hacker intrusion, the person with malicious intent, for example, a third party who intrudes the system through the network, can use the writing function to tamper or erase the data or codes stored in the memory, so as to break the operation of the system of the electronic product.

In order to effectively prevent the data stored in the memory from being tampered, destroyed or even maliciously erased by the person with malicious intent, the present invention proposes a data processing system and data processing method to provide physical write protection mechanism, rather than electrical write protection mechanism, thereby effectively blocking any malicious write or erase operation.

SUMMARY OF THE INVENTION

In order to solve the conventional problems, the present invention is to provide a data processing system having a write protection mechanism, and a data processing method thereof.

According to an embodiment, the present invention provides a data processing system comprising a memory device, a predetermined voltage generating circuit, and a reference voltage generating circuit. The memory device is configured to store system data, and the memory device is operated based on a system high voltage. The predetermined voltage generating circuit is coupled to the memory device, and configured to generate a predetermined voltage with a target voltage level according to the reference voltage. The target voltage level is a voltage level for a writing operation or an erasing operation of the memory device, and the target voltage level is higher than a voltage level of the system high voltage. The reference voltage generating circuit is coupled to the predetermined voltage generating circuit, and configured to generate the reference voltage. A voltage generator of the reference voltage generating circuit is enabled or disabled according to a write protection signal, so as to selectively output the reference voltage. When the voltage generator is disabled, the reference voltage is not outputted, and the predetermined voltage with the target voltage level is not generated.

According to an embodiment, the present invention provides a data processing method which is applied to a data processing system comprising a memory controller, a memory device, a predetermined voltage generating circuit and a reference voltage generating circuit. The predetermined voltage generating circuit generates a predetermined voltage with a target voltage level according to a reference voltage, and the target voltage level is a voltage level for a writing operation or an erasing operation of the memory device. The method comprises steps of: detecting an abnormal condition of the data processing system; when the abnormal condition is detected, setting the write protection bit of the memory device as the predetermined value, wherein the write protection bit is set as a preset value when no abnormal condition is detected; and disabling a voltage generator of the reference voltage generating circuit according to the write protection bit; wherein when the voltage generator is disabled, the reference voltage is not outputted and the predetermined voltage with the target voltage level is not generated.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
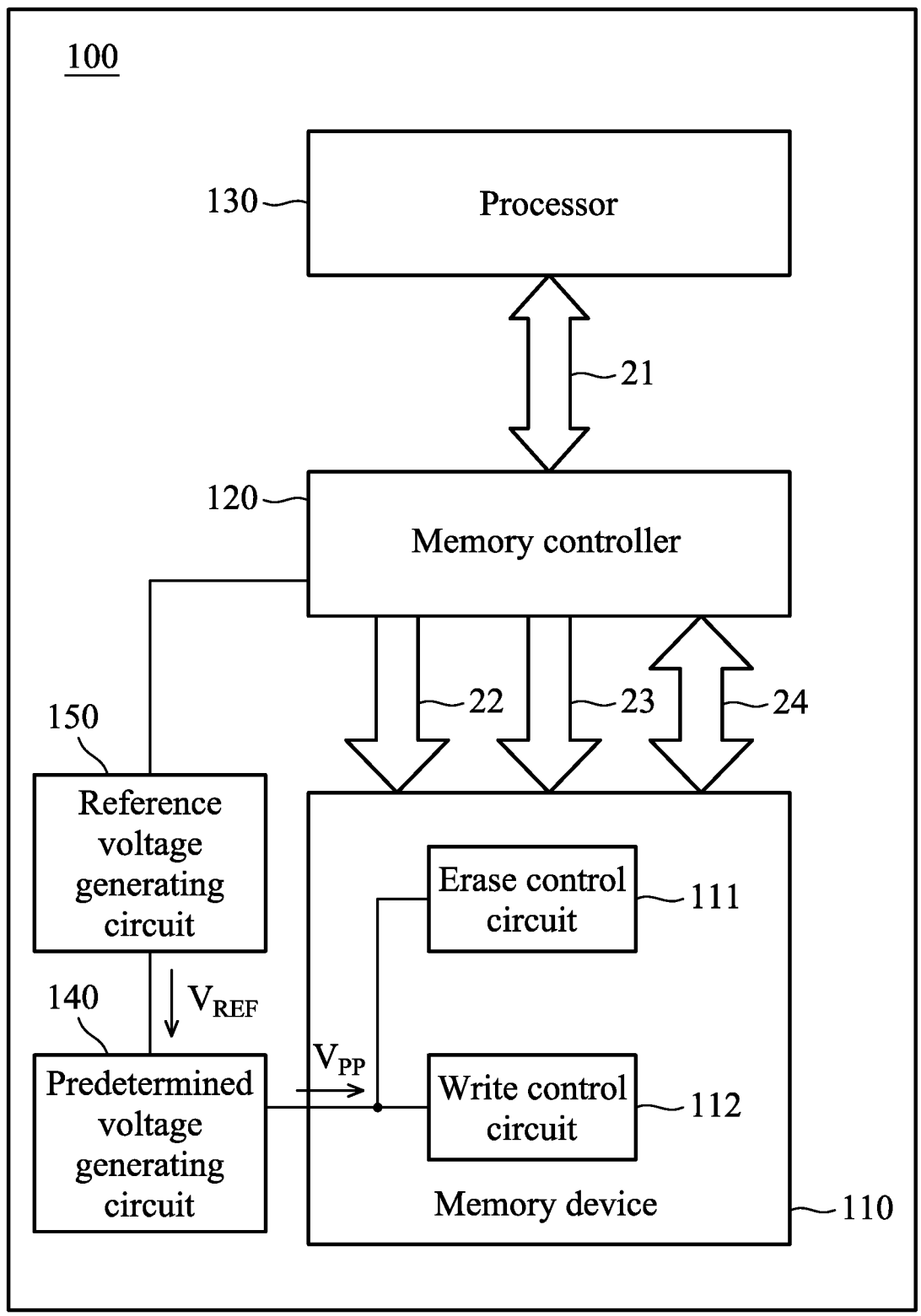
FIG. 1 is a block diagram of a data processing system according to an embodiment of the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be acknowledged to imply the inclusion of stated elements but not the exclusion of any other elements.

FIG. 1 is a block diagram of a data processing system according to an embodiment of the present invention. In an embodiment, a data processing system 100 is a microcontroller unit. The data processing system 100 can comprise a memory device 110, a memory controller 120 and a processor 130. It should be noted that FIG. 1 is a simplified block diagram merely showing the components related to the present invention, and the persons skilled in the art can understand that the data processing system also comprises other components not shown in FIG. 1.

According to an embodiment, the memory device 110 is configured to store codes, and data or parameters required for system operation. The data or parameter is referred to as system data hereafter. According to an embodiment, the memory device 110 can be a flash memory.

The memory controller 120 is coupled between the processor 130 and the memory device 110, and configured to control access of the memory device 110.

The processor 130 can output an access control signal to the memory controller 120, and the memory controller 120 can access the memory device 110 in response to the access control signal. The processor 130 can access the memory device 110 through the memory controller 120, so as to fetch the codes to be executed and the required system data. In an embodiment, the code can include at least one instruction. The processor 130 executes the corresponding instruction according to the content of fetched code.

More specifically, the processor 130 can be coupled to the memory controller 120, through a bi-directional bus 21, and configured to transmit a plurality of control signals, such as access control signals or erase control signals, to the memory controller 120 and to receive the codes and system data fetched from the memory device 110 through the memory controller 120.

The memory controller 120 can be coupled to the memory device 110 through a plurality of buses. For example, a control bus 22 is used to transmit a plurality of control commands, an address bus 23 can be used to transmit addresses of the data to be accessed, and a data bus 24 is a bi-directional bus for transmitting the data to be written into the memory device 110 and receiving the data fetched from the memory device 110.

According to an embodiment, the data processing system 100 can comprise a predetermined voltage generating circuit 140 and a reference voltage generating circuit 150. The predetermined voltage generating circuit 140 is coupled to the memory device 110, and configured to generate a predetermined voltage $V_{PP}$ with a target voltage level according to the reference voltage $V_{REF}$. According to an embodiment, the memory device 110 can operate based on a system high voltage $V_{DD}$; for example, the read operation of the memory device 110 can be executed according to the system high voltage $V_{DD}$. The target voltage level is a voltage level for a writing operation or an erasing operation of the memory device 110, and the target voltage level is higher than the voltage level of the system high voltage $V_{DD}$. The reference voltage generating circuit 150 is coupled to the predetermined voltage generating circuit 140 and the memory controller 120, and configured to provide the reference voltage $V_{REF}$.

According to an embodiment, a voltage generator, which is disposed inside the reference voltage generating circuit 150 and configured to generate the reference voltage $V_{REF}$, can be enabled or disabled according to the write protection signal, so as to selectively output the reference voltage $V_{REF}$.

According to an embodiment, the predetermined voltage generating circuit 140 generates the predetermined voltage $V_{PP}$ with a target voltage level according to the reference voltage $V_{REF}$. The predetermined voltage $V_{PP}$ can be supplied to an erase control circuit 111 and a write control circuit 112 disposed inside the memory device 110. In response to the erase command outputted by the memory controller 120, the erase control circuit 111 can perform an erasing operation on the corresponding region or address of the memory device 110 according to the predetermined voltage $V_{PP}$. Similarly, in response to the write command outputted by the memory controller 120, the write control circuit 112 can perform the writing operation on the corresponding region or address of the memory device 110 according to the predetermined voltage $V_{PP}$.

According to an embodiment, the predetermined voltage generating circuit 140 can be disposed inside the memory device 110 or can be disposed outside the memory device 110. The predetermined voltage generating circuit 140 can comprise a boost circuit configured to rise the system high voltage $V_{DD}$ to generate the predetermined voltage $V_{PP}$ having the target voltage level. The reference voltage $V_{REF}$ is supplied to the predetermined voltage generating circuit 140 as a determination reference for whether to continue or stop boosting operation.

In general, in normal operation, the voltage generator for generating the reference voltage $V_{REF}$ is enabled to provide the reference voltage $V_{REF}$ required by the predetermined voltage generating circuit 140. According to an embodiment of the present invention, in order to effectively prevent the data stored in the memory from being falsified, destroyed or even maliciously erased by a person with bad intention, when the processor 130 or the memory controller 120 determines that the data processing system 100 currently has a risk of being maliciously intruded, the reference voltage generating circuit 150 can disable the voltage generator according to the write protection signal, so as to stop the voltage generator from generating and outputting the reference voltage $V_{REF}$. Once the reference voltage $V_{REF}$ is not provided, the predetermined voltage generating circuit 140 cannot generate the predetermined voltage $V_{PP}$ with the target voltage level. When the predetermined voltage $V_{PP}$ with the target voltage level is not supplied, even the memory controller 120 generates the erase enable signal ERASE according to the erase command, which is possibly generated by a malicious person, the erase control circuit 111 still cannot execute the corresponding erasing operation, so that the data stored in this memory device 110 is protected from being erased. As a result, the purpose of physically preventing erasing operation and effectively blocking any possible malicious erasing operation, can be achieved.

Similarly, when the predetermined voltage $V_{PP}$ with the target voltage level is not supplied, even the memory controller 120 generates the write enable signal WR according to the write command, which is possibly generated by a malicious person, the write control circuit 112 still cannot execute the corresponding writing operation, so that the memory device 110 can be protected from being written. As a result, physical write protection and the purpose of effectively blocking any possible malicious erasing operation, can be achieved.

According to an embodiment, when the processor 130 or the memory controller 120 detects an abnormal change in internal temperature or ambient temperature of the data processing system 100, or in operating frequency required for internal components of the data processing system 100, or in system voltage required by the data processing system, the processor 130 or the memory controller 120 can determine that the data processing system 100 has currently the risk of being maliciously intruded. Since the abnormal temperature, frequency or voltage possibly cause malfunction of program, the processor 130 or the memory controller 120 can use the abnormal change in temperature, frequency or voltage as one of the factors for determining whether there is a risk of malicious intrusion.

It is worth noting that, according to an embodiment, the writing operation can be that the write control circuit 112 rewrites the data content of the corresponding area or address from bit 1 to bit 0, and the erasing operation can be that the erase control circuit 111 rewrites the data content of the corresponding area or address from bit 0 to bit 1. The erasing operation can also be regarded as a writing operation, or the writing operation and the erasing operation can be collectively referred to as programming operations.

Figure 2:
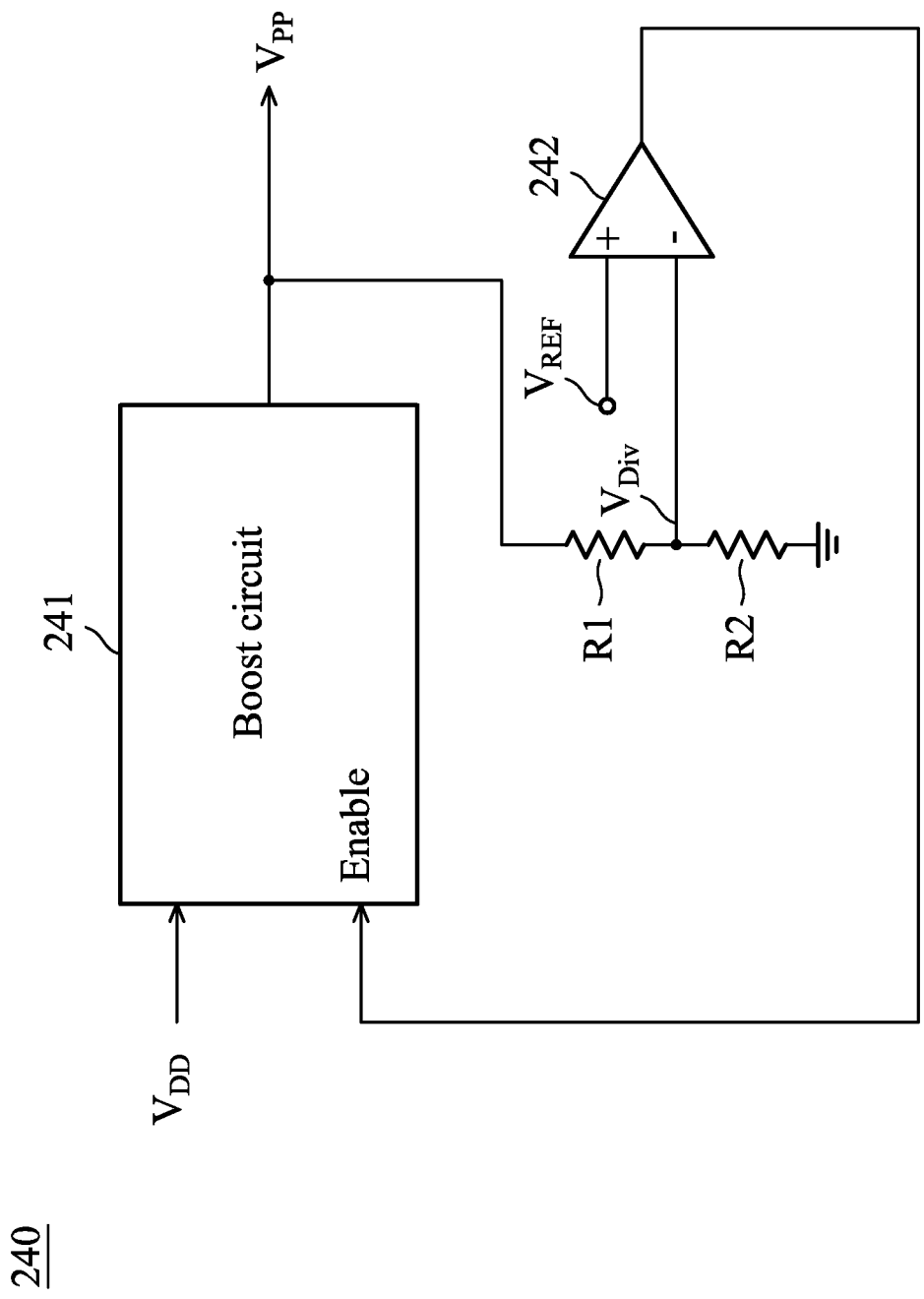
FIG. 2 is an exemplary circuit diagram of a predetermined voltage generating circuit according to an embodiment of the present invention.

FIG. 2 is an exemplary circuit diagram of a predetermined voltage generating circuit according to an embodiment of the invention. The predetermined voltage generating circuit 240 can comprise a boost circuit 241 and a comparator 242. According to an embodiment, the boost circuit 241 can be a charge pump. The boost circuit 241 can receive the system high voltage $V_{DD}$ and rise the system high voltage $V_{DD}$ to generate the predetermined voltage $V_{PP}$. The boost circuit 241 can receive the enable signal Enable, and the enable signal Enable can be used to indicate whether the boost circuit 241 continues or stops the boosting operation. The comparator 242 receives the reference voltage $V_{REF}$ and the node voltage $V_{Div}$, and compares the reference voltage $V_{REF}$ with the node voltage $V_{Div}$ to output a comparison result which serves as the enable signal Enable. According to an embodiment, the resistors R1 and R2 are connected in series between the output terminal of the boost circuit 241 and a ground terminal, and configured to provide the node voltage $V_{Div}$ according to the predetermined voltage $V_{PP}$. According to an embodiment, when the reference voltage $V_{REF}$ is higher than the node voltage $V_{Div}$, the comparison result outputted from the comparator 242 is 1 and the enable signal Enable is also 1 to indicate the boost circuit 241 to continue the boosting operation. When the reference voltage $V_{REF}$ is not higher than the node voltage $V_{Div}$, the comparison result outputted from the comparator 242 is 0 and the enable signal Enable is also 0 to indicate the boost circuit 241 to stop executing the boosting operation. According to an embodiment, the node voltage $V_{Div}$ is proportional to the predetermined voltage $V_{PP}$. When the predetermined voltage $V_{PP}$ is risen to the target voltage level, a relationship between the predetermined voltage $V_{PP}$ and the reference voltage $V_{REF}$ is $V_{PP}=(R1+R2)/R2*V_{REF}$. At this time, the node voltage $V_{Div}$ is no longer less than the reference voltage $V_{REF}$, so that the enable signal Enable is 0 to indicate the boost circuit 241 to stop executing the boosting operation.

According to an embodiment, when the reference voltage $V_{REF}$ is not supplied, the comparison result outputted from the comparator 242 is 0 and the enable signal Enable is also 0, so that the boost circuit 241 stops executing the boosting operation, and the predetermined voltage generating circuit 240 cannot execute the boosting operation to rise the predetermined voltage $V_{PP}$ to the target voltage level. As a result, the predetermined voltage generating circuit 240 cannot output enough voltage to control the erase control circuit 111 and the write control circuit 112 to perform erasing and writing operations. As a result, the purpose of physically preventing the memory device from being programmed, and effectively blocking any potentially malicious programming operations, can be achieved.

It is worth noting that, the predetermined voltage generating circuit 240 shown in FIG. 2 is one of the circuits that can be implemented according to the concept of the present invention, but the predetermined voltage generating circuit of the present invention is not limited to the example shown in FIG. 2.

Figure 3:
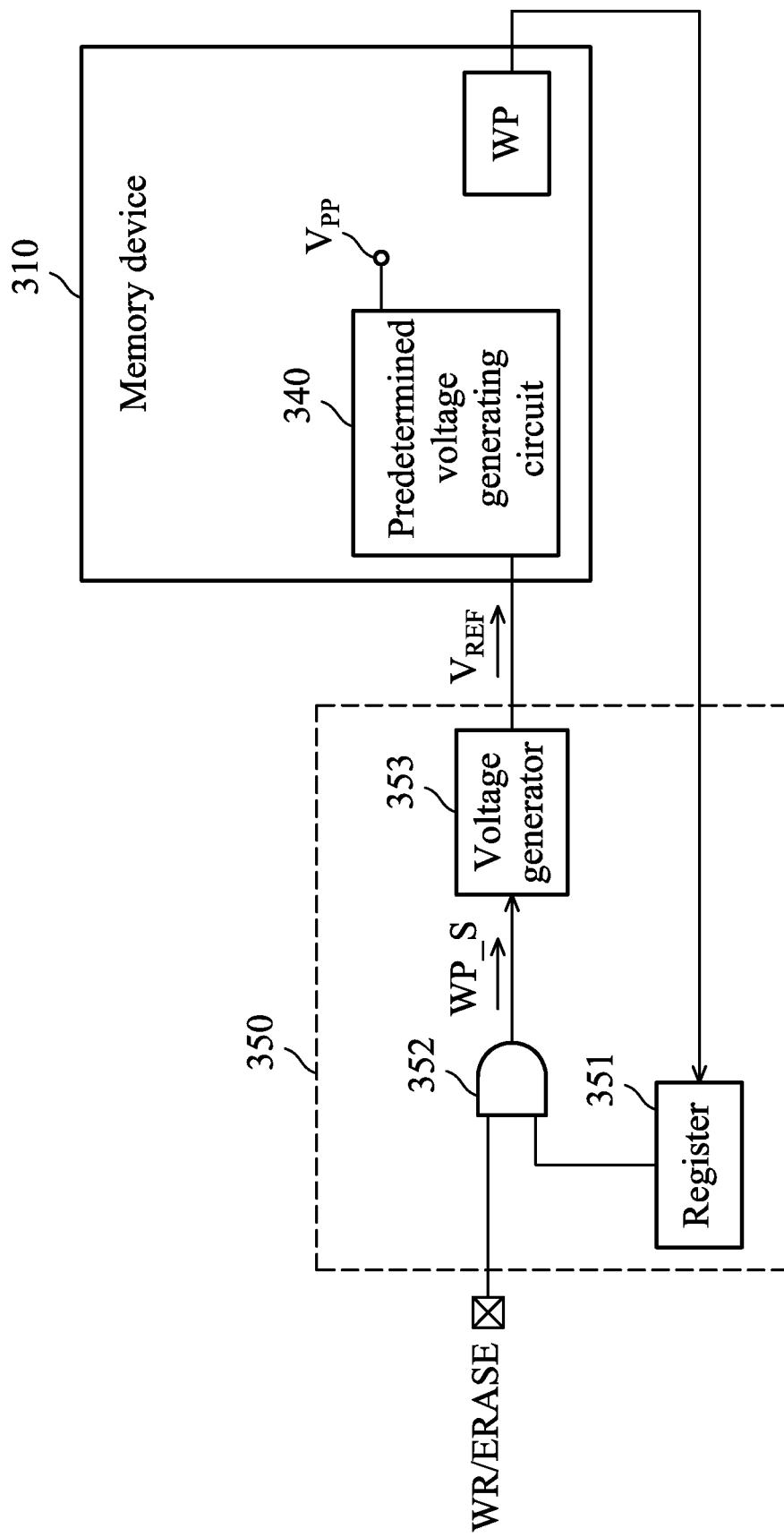
FIG. 3 is an exemplary circuit diagram of a reference voltage generating circuit according to an embodiment of the present invention.

Please refer to FIG. 3, which is an exemplary circuit diagram of a reference voltage generating circuit according to an embodiment of the invention. According to an embodiment, the reference voltage generating circuit 350 can comprise a register 351, a logic circuit 352 and a voltage generator 353. The register 351 can store a write protection value. According to an embodiment, the write protection value is set according to a write protection bit WP of a memory device 310. The logic circuit 352 can generate a write protection signal WP_S according to the write protection value, and a write enable signal WR or an erase enable signal ERASE, and it depends on whether the currently received memory programming instruction is a writing operation or an erasing operation. The voltage generator 353 can receive the write protection signal WP_S, and selectively generate the reference voltage $V_{REF}$ according to the write protection signal WP_S.

According to an embodiment, the memory device 110/310 can store the write protection bit WP. When the data processing system 100 is activated or the processor or the memory controller does not detect any abnormal condition, the write protection bit WP is set as a preset value, such as a logical value 1. When the data processing system 100 is activated, the memory controller can load the write protection bit WP into the register 351, and then control the memory device 110/310.

When the processor or the memory controller detects an abnormal condition, the memory controller can set the write protection bit WP as a predetermined value, such as a logical value 0. The memory controller can load the write protection bit WP into the register 351, to set the write protection value stored in the register 351 according to the write protection bit WP, so that the write protection value can have the corresponding value, such as the logical value 0. The logic circuit 352 can generate the write protection signal WP_S according to a logic computation result of the write protection value, and a write enable signal WR or an erase enable signal ERASE. According to an embodiment, the logic circuit 352 can be an AND logic gate, so that the outputted write protection signal WP_S can have the predetermined signal level, such as the logical value 0, as long as one of the write protection value and the write enable signal WR/erase enable signal ERASE is set to the predetermined value, such as the logical value 0. As a result, when the write protection signal WP_S is set as the predetermined value, the voltage generator 353 is disabled and the reference voltage $V_{REF}$ is not outputted.

It is worth noting that the logic gate is merely one of the options that can be implemented in accordance with the concepts of the present invention, and the logic circuit of the present invention is not limited to the AND logic gate. The logic circuit can also be implemented by at least one other logic gate.

In the embodiment, a predetermined voltage generating circuit 340 can be a voltage generating circuit built in the memory device 310, but the present invention is not limited thereto. The predetermined voltage generating circuit 340 can receive the reference voltage $V_{REF}$ to generate the predetermined voltage $V_{PP}$ with the target voltage level. According to an embodiment, when the reference voltage $V_{REF}$ is supplied to the predetermined voltage generating circuit 340, the predetermined voltage generating circuit 340 can use the reference voltage $V_{REF}$ as a determination reference for whether to continue or stop the boosting operation, and configured to generate the predetermined voltage $V_{PP}$ having the target voltage level.

When the voltage generator 353 is disabled, the reference voltage $V_{REF}$ is not outputted. When the reference voltage $V_{REF}$ is not supplied to the predetermined voltage generating circuit 340, the predetermined voltage generating circuit 340 cannot generate the predetermined voltage $V_{PP}$ with the target voltage level, so that the memory device is protected from being written and the data stored in the memory device is also protected from being erased. It is worth noting that once the write protection bit WP is set to the predetermined value, such as the logical value 0, the memory device is protected from being programmed. At this time, even the write enable signal WR or the erase enable signal ERASE is set, for example, as the logical value 1, the memory device is prevented from being programmed. As a result, a malicious third party cannot invade the system and program the memory device by any means, and any malicious programming operations can be blocked.

According to an embodiment, the memory device is protected from being programmed when the write protection bit WP is set to the predetermined value. In order to restore the programming function of the memory device, a user must obtain the memory device and supply the memory device with the predetermined voltage $V_{PP}$ with the target voltage level through the external device, to erase the write protection bit WP, and after the write protection bit WP is restored to the preset value, the programming function (write/erase function) of the memory device can be restored. Since the user must physically obtain the memory device and supply the predetermined voltage $V_{PP}$ to restore the programming function of the memory device, the programming function of the memory device cannot be recovered by a remote manner through network, thereby ensuring the security of the memory device.

According to another embodiment of the present invention, one or more sets of passwords can be previously stored through the software/firmware of the data processing system, and the data processing flow can be defined that when the user wants to erase the write protection bit WP set as the predetermined value, the user must input the correct password to erase the write protection bit WP, thereby providing additional protection for the security of the memory device.

Figure 4:
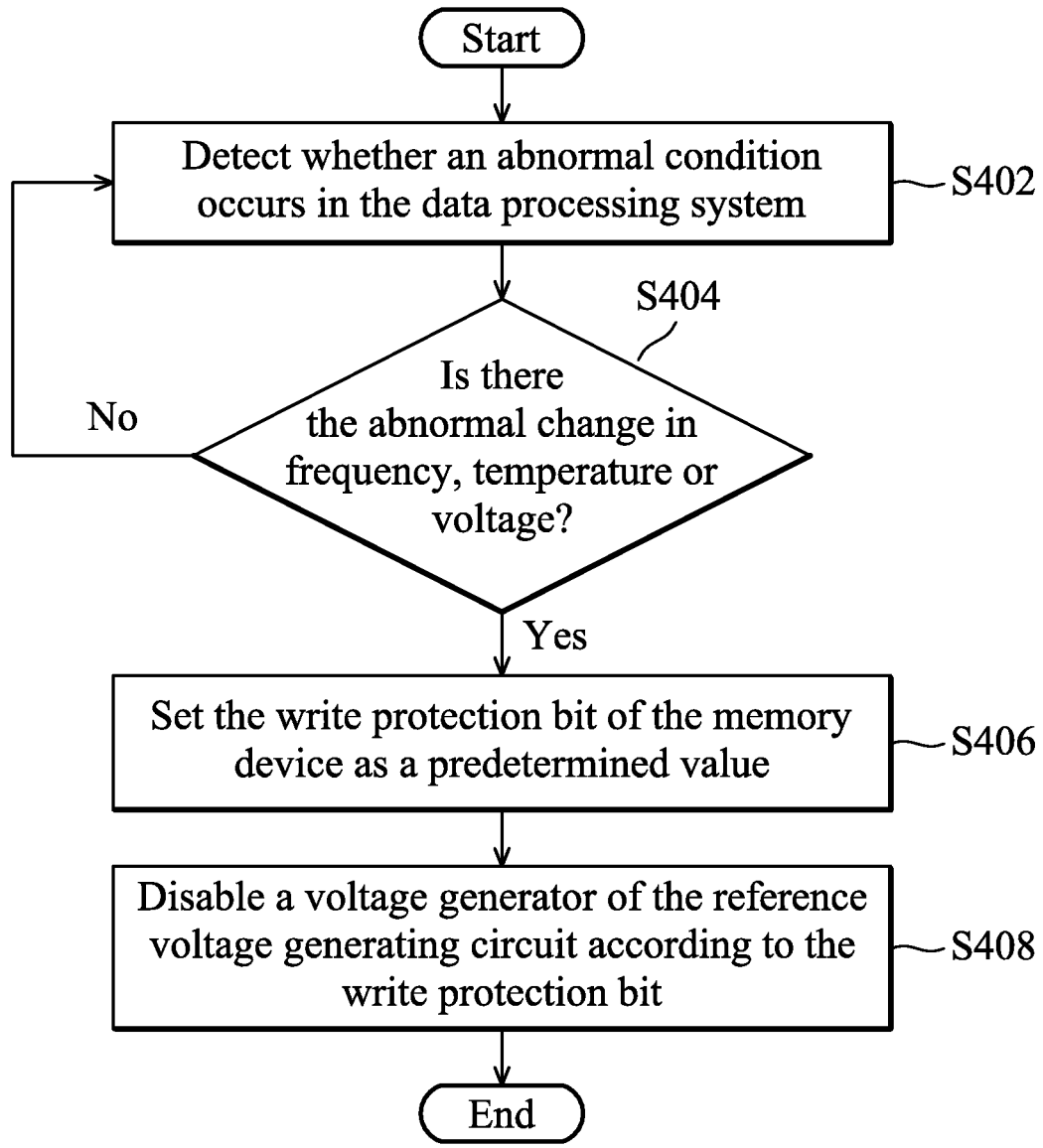
FIG. 4 is an exemplary flowchart of a data processing method according to an embodiment of the present invention.

Please refer to FIG. 4, which is an exemplary flowchart of a data processing method according to an embodiment of the invention. The data processing method is applicable to a data processing system including a memory controller, a memory device, a predetermined voltage generating circuit and a reference voltage generating circuit. The predetermined voltage generating circuit generates a predetermined voltage with a target voltage level according to the reference voltage. The target voltage level is a voltage level for a writing operation or an erasing operation of the memory device. The data processing method includes steps 402 to 408. In a step S402, the processor 130 or the memory controller 120 continuously detects whether an abnormal condition occurs in the data processing system. For example, the processor 130 or the memory controller 120 can continuously detect whether there is an abnormal change in an internal temperature or an ambient temperature of the data processing system 100, any operating frequency of internal element of the data processing system 100 or any system voltage required by the data processing system 100. In a step S406, when the processor 130 or the memory controller 120 detects the abnormal change in frequency, temperature or voltage (step S404), the write protection bit of the memory device is set as a predetermined value. The predetermined value is different from a preset value which is initially set in the write protection bit and also set to the write protection bit when no abnormal condition is detected. Next, in a step 408, a voltage generator of the reference voltage generating circuit is disabled according to the write protection bit. The reference voltage generating circuit can be enabled or disabled according to the different values of the write protection bit. When the voltage generator is disabled, the reference voltage is not outputted and the predetermined voltage with the target voltage level is not generated, so that the memory device is protected from being written, and the data stored in the memory device is protected from being erased. As a result, the memory device is prevented from being programmed even if the write enable signal WR or the erase enable signal ERASE is set, for example, as logical value 1. In this case, a malicious person cannot invade the system and program the memory device by any means, and any malicious programming operation can be blocked.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A data processing system, comprising:
a memory device configured to store system data, wherein the memory device is operated based on a system high voltage;
a predetermined voltage generating circuit coupled to the memory device, and configured to generate a predetermined voltage with a target voltage level according to a reference voltage, wherein the target voltage level is a voltage level for a writing operation or an erasing operation of the memory device, and the target voltage level is higher than a voltage level of the system high voltage; and
a reference voltage generating circuit coupled to the predetermined voltage generating circuit, and configured to generate the reference voltage, wherein a voltage generator of the reference voltage generating circuit is enabled or disabled according to a write protection signal, so as to selectively output the reference voltage;

wherein when the voltage generator is disabled, the reference voltage is not outputted, and the predetermined voltage with the target voltage level is not generated, wherein when an abnormal condition of the data processing system is detected, the write protection signal has a predetermined signal level, and the voltage generator is disabled in response to the write protection signal having the predetermined signal level, so that the memory device is protected from being written and the data stored in the memory device is protected from being erased.

2. The data processing system according to claim 1, wherein when the predetermined voltage with the target voltage level is not generated, the memory device is protected from being written and the data stored in this memory device is protected from being erased.

3. The data processing system according to claim 1, wherein the reference voltage generating circuit comprises:
a register configured to store a write protection value, wherein the write protection value is set according to a write protection bit of the memory device;
a logic circuit configured to generate the write protection signal according to the write protection value, and a write enable signal or an erase enable signal; and
the voltage generator configured to receive the write protection signal, and selectively generate the reference voltage according to the write protection signal.

4. The data processing system according to claim 3, further comprising:
a memory controller coupled to the memory device and the reference voltage generating circuit, and configured to set the write protection bit, and set the write protection value according to the write protection bit.

5. The data processing system according to claim 4, wherein the memory controller further detects the abnormal condition of the data processing system, and when the abnormal condition is detected, the memory controller sets the write protection bit as the predetermined value, and when the write protection bit is set as the predetermined value, the write protection signal generated by the logic circuit has the predetermined signal level.

6. A data processing method, applied to a data processing system comprising a memory controller, a memory device, a predetermined voltage generating circuit and a reference voltage generating circuit, wherein the predetermined voltage generating circuit generates a predetermined voltage with a target voltage level according to a reference voltage, and the target voltage level is a voltage level for a writing operation or an erasing operation of the memory device, and the method comprising:
detecting an abnormal condition of the data processing system;
when the abnormal condition is detected, setting a write protection bit of the memory device as a predetermined value, wherein the write protection bit is set as a preset value when no abnormal condition is detected; and
disabling a voltage generator of the reference voltage generating circuit according to the write protection bit;
wherein when the voltage generator is disabled, the reference voltage is not outputted and the predetermined voltage with the target voltage level is not generated.

7. The data processing method according to claim 6, wherein when the predetermined voltage with the target voltage level is not generated, the memory device is protected from being written and the data stored in this memory device is protected from being erased.

8. The data processing method according to claim 6, further comprising:
setting a write protection value stored in a register, according to the write protection bit;
generating a write protection signal according to a logic computation result of the write protection value, and a write enable signal or an erase enable signal; and
selectively generating the reference voltage according to the write protection signal.

9. The data processing method according to claim 8, wherein when the write protection bit is set to be the predetermined value, the write protection signal generated according to the logic computation result has a predetermined signal level, and the voltage generator is disabled in response to the write protection signal having the predetermined signal level, so that the memory device is protected from being written and the data stored in the memory device is protected from being erased.

10. The data processing method according to claim 9, wherein the memory device is operated based on a system high voltage, and the target voltage level is higher than a voltage level of the system high voltage.

* * * * *